United States Patent
Eden et al.

(10) Patent No.: US 11,148,898 B2
(45) Date of Patent: Oct. 19, 2021

(54) METHOD AND SYSTEM FOR STACKING PRINTED SUBSTRATES

(71) Applicant: HEWLETT-PACKARD DEVELOPMENT COMPANY, L.P., Spring, TX (US)

(72) Inventors: Boaz Eden, Ness Ziona (IL); Pavel Epshtein, Ness Ziona (IL)

(73) Assignee: Hewlett-Packard Development Company, L.P., Spring, TX (US)

(*) Notice: Subject to any disclaimer, the term of this patent is extended or adjusted under 35 U.S.C. 154(b) by 0 days.

(21) Appl. No.: 16/605,894

(22) PCT Filed: Dec. 13, 2017

(86) PCT No.: PCT/US2017/066202
§ 371 (c)(1),
(2) Date: Oct. 17, 2019

(87) PCT Pub. No.: WO2019/117898
PCT Pub. Date: Jun. 20, 2019

(65) Prior Publication Data
US 2021/0094784 A1    Apr. 1, 2021

(51) Int. Cl.
*B65H 29/34* (2006.01)
*B65H 9/10* (2006.01)
(Continued)

(52) U.S. Cl.
CPC ............. *B65H 29/34* (2013.01); *B65H 9/101* (2013.01); *B65H 31/02* (2013.01); *B65H 31/20* (2013.01);
(Continued)

(58) Field of Classification Search
CPC .......... B65H 9/10; B65H 9/101; B65H 29/26; B65H 29/34; B65H 31/04; B65H 31/08;
(Continued)

(56) References Cited

U.S. PATENT DOCUMENTS 3,651,961 A * 3/1972 Hayes ................... B65H 29/34
414/791
3,951,264 A * 4/1976 Heidecker ............ G11B 17/049
206/308.3
(Continued)

FOREIGN PATENT DOCUMENTS

| EP | 1203710 | 5/2002 |
|---|---|---|
| GB | 2341598 | 3/2000 |
| JP | H054616 | 1/1993 |

OTHER PUBLICATIONS

Survey of Digital Press Manufacturers: Critical Paper Requirements, Jan. 2016, http://scholarworks.rit.edu/cgi/viewcontent.cgi?article=1035&context=books.

*Primary Examiner* — Prasad V Gokhale
(74) *Attorney, Agent, or Firm* — HP Inc. Patent Department

(57) ABSTRACT

An example stacking system comprises a stacking member movable between a first position in which the stacking member is configured to partially support a first stack of printed substrates, and a second position in which the stacking member is disengaged from the first stack. A receptacle positioned below the stacking member is configured to hold a second stack of printed substrates. A controller is configured to cause the stacking member to move between the first position and the second position when the first stack satisfies a criterion, thereby depositing the first stack into the receptacle on top of the second stack.

12 Claims, 9 Drawing Sheets

(51) Int. Cl.
*B65H 31/02* (2006.01)
*B65H 31/20* (2006.01)
*B65H 31/30* (2006.01)
*B65H 31/38* (2006.01)
*B65H 43/06* (2006.01)

(52) U.S. Cl.
CPC ......... *B65H 31/3018* (2013.01); *B65H 31/38* (2013.01); *B65H 43/06* (2013.01); *B65H 2301/4212* (2013.01); *B65H 2301/4222* (2013.01); *B65H 2301/42194* (2013.01); *B65H 2301/42261* (2013.01); *B65H 2405/114* (2013.01); *B65H 2511/152* (2013.01)

(58) Field of Classification Search
CPC  B65H 31/20; B65H 31/3009; B65H 31/3018; B65H 31/34; B65H 31/36; B65H 31/38; B65H 43/06; B65H 2301/4212; B65H 2301/42194; B65H 2301/4222; B65H 2301/42261; B65H 2404/70; B65H 2404/722; B65H 2404/725; B65H 2405/1122; B65H 2405/1134; B65H 2405/114; B65H 2405/332; B65H 2511/10; B65H 2511/11; B65H 2511/12; B65H 2511/152
See application file for complete search history.

(56) References Cited

U.S. PATENT DOCUMENTS

| | | | |
|---|---|---|---|
| 4,475,730 A | | 10/1984 | Trogan |
| 5,255,584 A | * | 10/1993 | Fakler ............... B65B 35/50 414/790 |
| 5,287,164 A | | 2/1994 | Watanabe |
| 5,553,536 A | | 9/1996 | Van Os |
| 5,671,920 A | | 9/1997 | Acquaviva |
| 6,102,842 A | | 8/2000 | Harris |
| 6,231,039 B1 | * | 5/2001 | Chung ............... B65H 31/02 270/58.01 |
| 6,722,650 B1 | * | 4/2004 | Abbata ............... B65H 29/34 271/213 |
| 6,819,906 B1 | * | 11/2004 | Herrmann ......... G03G 15/6541 270/58.11 |
| 7,175,174 B2 | * | 2/2007 | Terao ................. B42C 1/12 270/58.08 |
| 7,193,310 B2 | | 3/2007 | Reefers et al. |
| 7,213,807 B2 | | 5/2007 | Blanchard et al. |
| 7,887,051 B2 | | 2/2011 | Hirokawa et al. |
| 8,100,393 B2 | | 1/2012 | Ray et al. |
| 2009/0110458 A1 | | 4/2009 | Mahito |
| 2014/0193233 A1 | | 7/2014 | Matsumoto et al. |

* cited by examiner

METHOD AND SYSTEM FOR STACKING PRINTED SUBSTRATES

BACKGROUND

Printer systems are arranged to print printing fluid, such as ink, on to substrates. Once the substrates have been printed on, the printed substrates may be stacked on top of each other. In an example printer system, the printed substrates are transported on vacuum belts to a location in which they are to be stacked.

BRIEF DESCRIPTION OF THE DRAWINGS

Various features of the present disclosure will be apparent from the detailed description which follows, taken in conjunction with the accompanying drawings, which together illustrate features of the present disclosure, and wherein.

DETAILED DESCRIPTION

Figure 1:
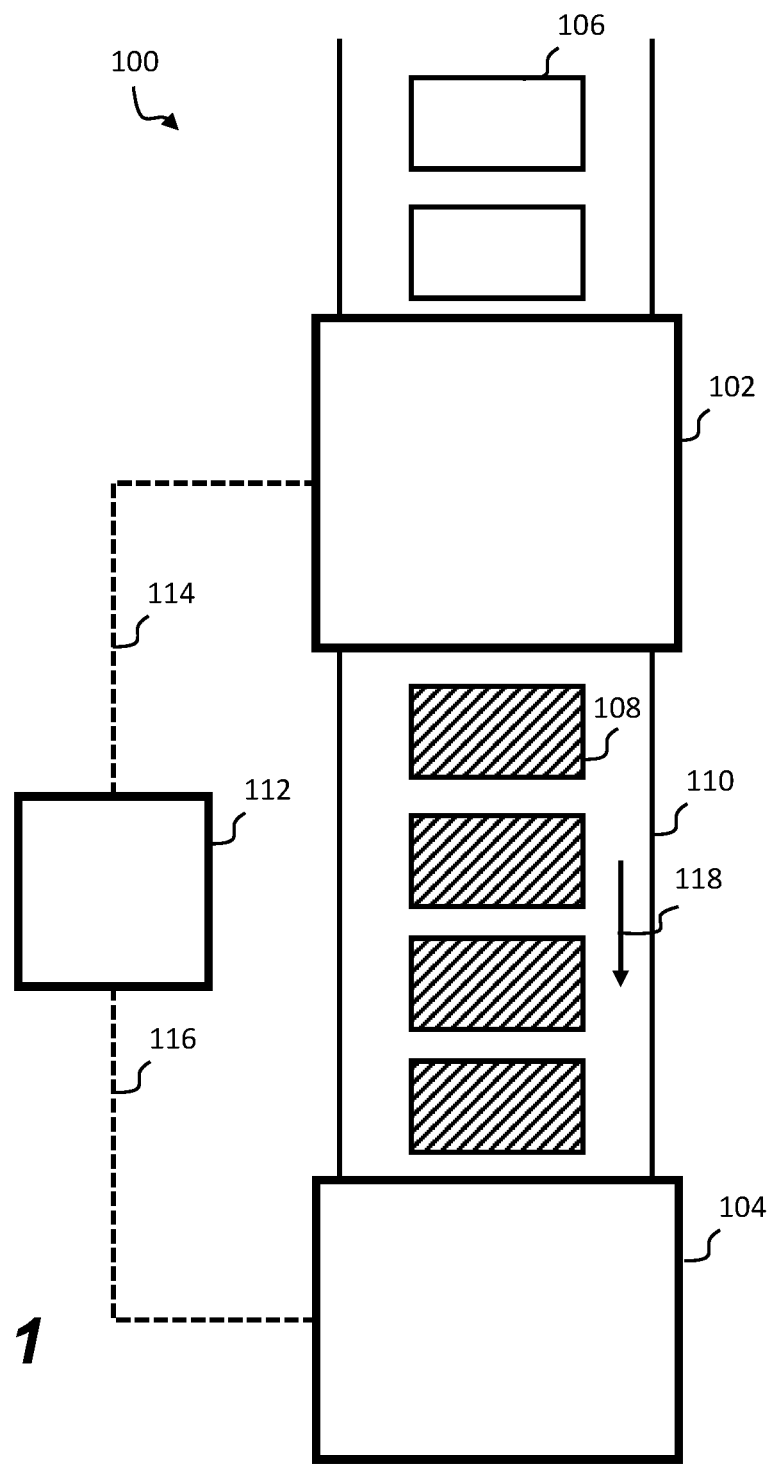
FIG. 1 is a diagrammatic representation showing a top view of a printing system in accordance with an example.

In the following description, for purposes of explanation, numerous specific details of certain examples are set forth. Reference in the specification to "an example" or similar language means that a particular feature, structure, or characteristic described in connection with the example is included in at least that one example, but not necessarily in other examples.

As described herein, an example stacking system comprises a stacking member, movable between a first position in which the stacking member is configured to partially support a first stack of printed substrates, and a second position in which the stacking member is disengaged from the first stack. The stacking system may further comprise a receptacle positioned below the stacking member that is configured to hold a second stack of printed substrates. A controller may be configured to cause the stacking member to move between the first position and the second position when the first stack satisfies a criterion, thereby depositing the first stack into the receptacle on top of the second stack.

The example stacking system can more precisely position printed substrates in a stack. For example, the use of one or more stacking members, and stacking the first stack independently of the second stack, may allow the positioning of the substrates to be accurately controlled.

For example, a first stacking scheme may specify a stack quality specification. The stack quality specification may specify that the maximum offset between substrates in a stack is no greater than a predetermined measurement value, such as about 10 mm, about 5 mm, or about 3 mm for example. Hence the stack quality specification may specify that the stack of printed substrates is well-ordered, and each substrate within the stack is well-aligned with the other substrates in the stack. In the stacking system described herein, by sequentially receiving and stacking a plurality of printed substrates on the stacking member to create a first stack of substrates, the stack can be positioned and adjusted accurately before depositing the first stack onto a second stack of substrates located below.

In addition, by keeping the first stack initially at least partially separate from the second stack, the substrates within the first stack can be ordered and aligned before placing onto the second stack. This ordering and alignment can be achieved by agitating the substrates within the first stack in one or more directions. For example, the substrates can be vibrated back and forth along a first axis to align the substrates along the first axis, and the substrates can be vibrated back and forth along a second, perpendicular axis, to align the substrates along the second axis. The first axis may be aligned with a length direction of the substrate, perpendicular to a transport direction. The second axis may be aligned with a width direction of the substrate, parallel to the transport direction.

A second stacking scheme may specify how substrates of different sizes/dimensions are stacked on top of each other. For example, a first batch of substrates may be of the same size, whereas a second subsequent batch of substrates may be of a different size to the first batch. The second batch may have different length and/or width dimensions to the first batch. Rather than creating a new, separate stack, the second batch may be stacked on top of the first batch in different ways. For example, the first and second batches may be aligned along a predetermined edge of the substrates, such as a trailing edge, a leading edge, a left edge and a right edge relative to a transport direction. In the stacking system described herein, allowing for a second stacking scheme can be achieved by using one or more stacking members. By sequentially receiving and stacking a plurality of printed substrates on the stacking member to create a first stack of substrates, the stack can be moved relative to the second stack of substrates below. One or more other elements may also be used to aid movement in other spatial dimensions, such as a direction or axis parallel to the transport direction. Alternatively, or additionally, spacing between the stacking members and/or other elements can be adjusted so that substrates of different sizes can be received.

A third stacking scheme may specify how batches of substrates are distinguished from other batches. For example, batches or print-jobs may be offset or displaced from each other. The offset may be along a length direction of the substrate, perpendicular to a transport direction. Each batch may then be easily identifiable from other batches. In the stacking system described herein, an offset may be achieved by using one or more stacking members. By sequentially receiving and stacking a plurality of printed substrates on the stacking member to create a first stack of substrates, the stack can be moved relative to the second stack of substrates below. In some examples, the batches may be offset by about 30 mm, about 25 mm or about 20 mm.

By using one or more stacking members to create a first stack of substrates before stacking these on a second stack of substrates, the stacking system may stack substrates that are received at irregular intervals.

In some examples, the system may be able to stack substrates in all the ways discussed above. No rigorous calibration process may be needed to ensure that substrates being stacked are well-aligned before deposited on a stack. For example, vacuum belt stacking systems involve calibration specific to each job/batch being printed. This process is labour intensive, and is prone to noise which can result in the stack failing to meet the stack quality specification for example.

FIG. 1 is a schematic diagram showing a printer system 100 in accordance with an example. The printing system 100 comprises a printer 102 and a stacking system 104. The printing system 100 is configured to deposit printing fluid, such as ink, onto unprinted, or partially printed substrates 106. Once printed upon, the printed substrates 108 may travel along a conveyor belt 110, or any other conveying assembly, towards the stacking system 104 in a transport direction indicated by arrow 118. The stacking system 104 is configured to stack the plurality of printed substrates 108.

Components of the printing system 100 may be controlled by one or more controllers 112. The controller 112 may comprise one or more processors for example. The controller 112 may further comprise memory, configured to store instructions that when executed, cause the processor(s) to implement one or more methods. For example, the controller may control the printer 102, the conveyor assembly 110 and the stacking system 104. The memory may be a non-transitory computer-readable storage medium in some examples. The controller 112 may be connected directly or indirectly to the various components of the printing system 100 via one or more communication paths 114, 116, shown depicted as dashed lines. In the example of FIG. 1, the controller 112 is communicatively coupled to the printer 102 and the stacking system 104, however, greater or fewer communication paths may also be present. In other examples, the printer 102 and stacking system 104 each have their own controller, which may operate independently of each other.

Figure 2:
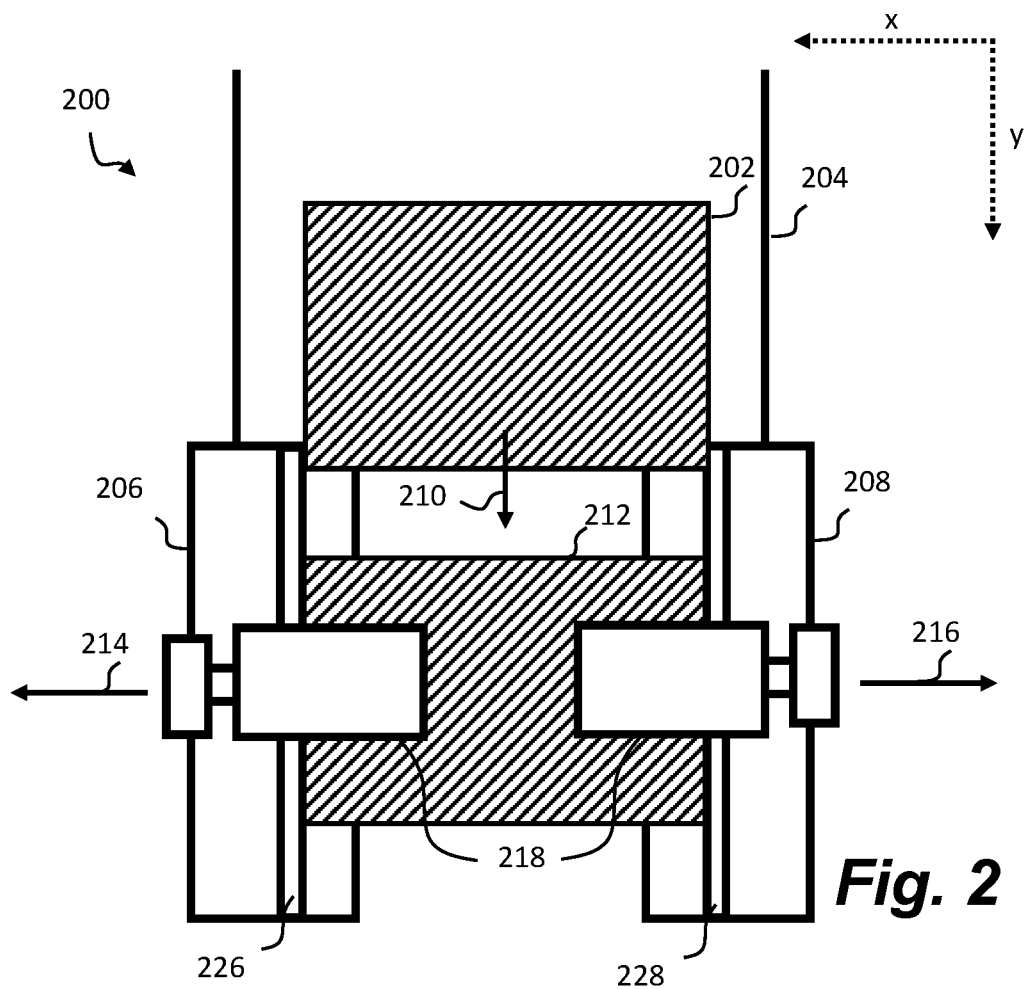
FIG. 2 is a diagrammatic representation showing a plan view of a stacking system in accordance with an example and arranged in a first configuration.
Figure 4:
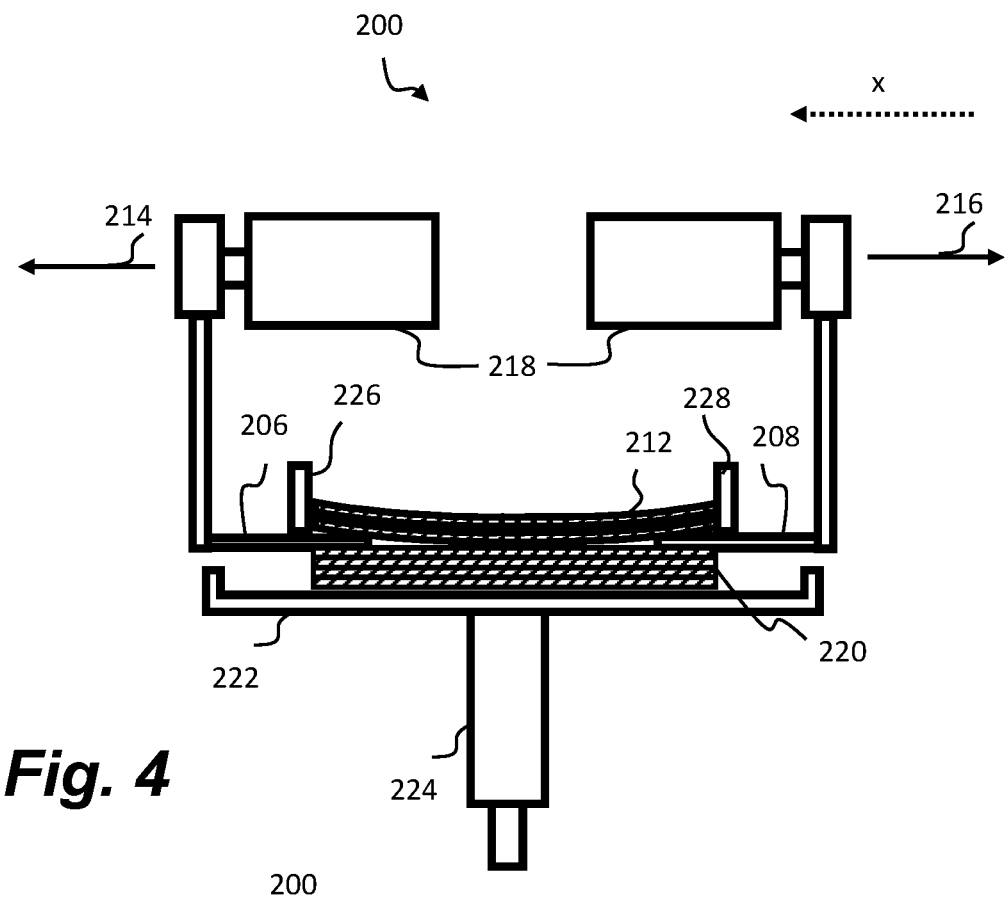
FIG. 4 is a diagrammatic representation showing a side view of the stacking system of FIG. 2 arranged in the first configuration.

FIG. 2 depicts a plan, or top-down view of an example stacking system 200 arranged according to a first configuration. FIG. 4 depicts a side view of the stacking system 200 in the first configuration. The stacking system 200 may be part of a printing system 100, for example. FIG. 2 shows printed substrates 202 being received in the stacking system 200 on a receiving assembly 204. In the example of FIG. 2, the receiving assembly comprises a conveyor belt, such as a vacuum belt, however in other systems the receiving assembly 204 may comprise a roller, a gripper bar, or flipping wheel, for example. The receiving assembly 204 is configured to receive the printed substrates 202 and position the substrates 202 within the stacking system 200. In FIG. 2, the receiving assembly 204 causes the substrates 202 to travel in a transport direction indicated by arrow 210.

The stacking system 200 comprises a first stacking member 206 and a second stacking member 208 upon which a plurality of printed substrates 202 are sequentially received and stacked, to form a first stack 212. The stacking members may have a generally flat or planar portion positioned underneath at least an edge region of the substrate and may be arranged either side of the transport direction. In other examples there may be one stacking member, or there may be more than two stacking members. The plurality of printed substrates 202 stacked on the stacking members 206, 208, may be partially supported by the stacking members 206, 208. For example, in FIGS. 2 and 4 the stacking members 206, 208 are positioned to engage with a peripheral or edge region of the substrates 202 stacked on the stacking members 206, 208. A peripheral or edge region may extend about 10 mm, about 25 mm, about 50 mm or about 100 mm from the edge of the substrate.

In some examples, the first stack 212 of printed substrates may bend slightly under the force of gravity as they are partially supported by the stacking members 206, 208. This is depicted in FIG. 4. In some examples a second stack 220 of printed substrates positioned underneath the first stack 212 also partially supports the first stack 212 while the first stack 212 is being stacked on the stacking members 206, 208. In some examples, the first stack 212 may be supported by a base of the receptacle 222. The extent to which the substrates bend may be dependent upon a variety of factors, such as thickness and material of the substrates, the area of substrate supported by the stacking members 206, 208 and the spacing between the stacking members 206, 208. Hence, in some examples, the substrates may experience little or no bending while supported by the stacking members 206, 208, the second stack 220 and/or the receptacle base.

In the configuration of FIGS. 2 and 4 the first stacking member 206 is positioned in a first position, such as a support position, in which the stacking member 206 is configured to partially support the first stack 212 of printed substrates. In this position, the first stacking member 206 engages the first stack 212 and an edge of the first stack 212 rests upon the first stacking member 206. The first stacking member 206 may be moveable between this first position and a second position, such as a drop position, in which the stacking member is disengaged from the first stack 212. For example, the first stacking member 206 may be moved along a first axis, in a direction 214 transverse to the transport direction 210 by an actuator, such as a piston 218. Similarly, in the configuration of FIGS. 2 and 4, the second stacking member 208 is positioned in a third position, such as a support position, in which the stacking member 208 is configured to partially support the first stack 212 of printed substrates. Hence an edge of the first stack 212 rests upon the second stacking member. The second stacking member 208 may be moveable between this third position and a fourth position, such as a drop position, in which the stacking member is disengaged from the first stack 212. For example, the second stacking member 208 may be moved along the first axis, in a direction 216 transverse to the transport direction by an actuator, which again is a piston 218. Direction 216 may be opposite to direction 214. Hence, the first and second stacking members may be moved along the first axis, but in opposite directions as they disengage from the first stack 212.

Figure 3:
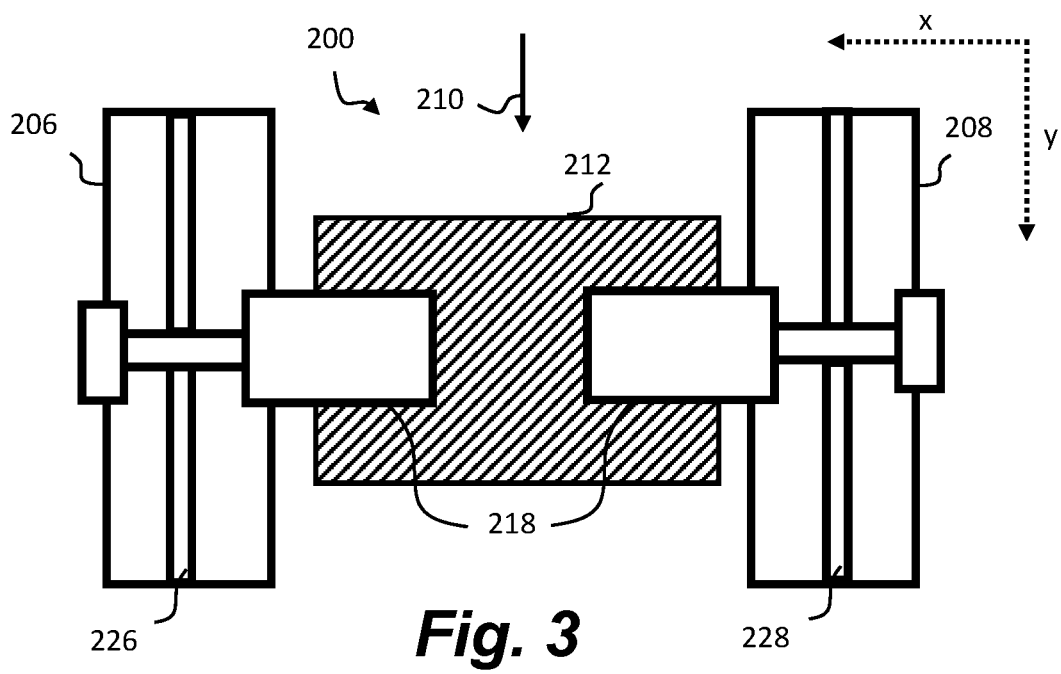
FIG. 3 is a diagrammatic representation showing a plan view of the stacking system of FIG. 2 arranged in a second configuration.
Figure 5:
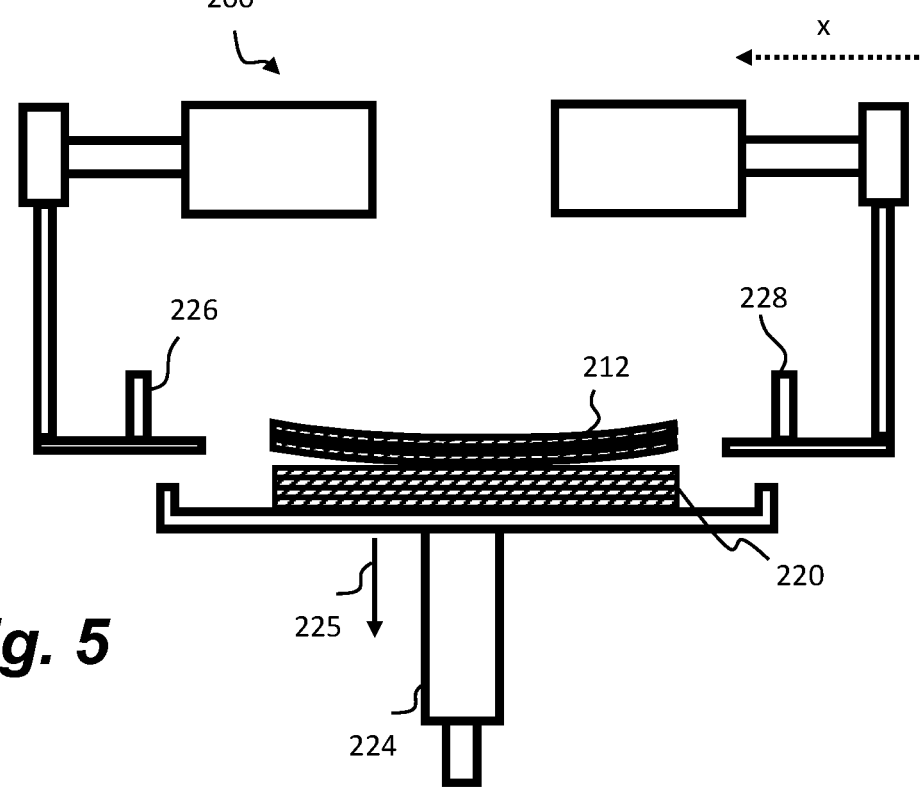
FIG. 5 is a diagrammatic representation showing a side view of the stacking system of FIG. 2 arranged in the second configuration.

FIG. 3 depicts a plan view of the example stacking system 200 arranged according to a second configuration after the first stacking member 206 has moved into the second position and after the second stacking member 208 has moved into the fourth position. FIG. 5 depicts a side view of the stacking system in the second configuration. In this configuration, the pistons 218 can be seen partially or fully extended as both stacking members 206 and 208 have been disengaged from the first stack 212. Accordingly, the first stack 212 is no longer supported by the stacking members 206, 208 and the first stack 212 may be deposited on a second stack 220 of printed substrates below.

Before receiving substrates to form the first stack, the first and second stacking members may be positioned in the first and third support positions respectively, so that the stacking members 206, 208 sequentially receive a plurality of substrates 202 to form the first stack 212 of substrates. Once the first stack 212 of substrates has been created, a controller may cause the stacking members 206, 208 to disengage from the first stack 212 by moving to the second and fourth drop positions, thereby causing the first stack 212 to deposit onto the second stack 220 arranged below the first stack 212. The second stack 220 may therefore comprise previously stacked printed substrates. The first stack 212 moves downwards under the action of gravity as the stacking members 206, 208 are removed from under the first stack 212. Any bending of the substrates will then be removed by the action of gravity, such that the substrates will lay substantially flat within the newly formed stack. After this new stack has been created, the procedure may be repeated; the stacking members 206, 208 move towards each other again, perpendicular to the transport direction, before receiving another stack of substrates.

To maintain the alignment of the first stack during the movement of the stacking members, the stacking members may be moved symmetrically relative to each about the transport direction. For example, the stacking members may move in opposite directions transverse to the transport direction at the same speed.

As mentioned, the first and second stacking members 206, 208 may each move. For example, they may move along a first axis in either direction. The movement direction may be defined relative to a first axis, such as the x-axis shown depicted in each of FIGS. 2-5. Movement along the first axis includes any motion substantially parallel to the x-axis, and includes both forwards and backwards motion along the x-axis. In some examples, the first axis and therefore the x-axis is defined as being perpendicular to the direction in which the plurality of printed substrates 202 are received from the printer (the transport direction indicated by arrow 210). In other examples, the first axis and therefore the x-axis is defined as an axis extending between the second and first stacking members. In other examples, the first axis and therefore the x-axis is defined as an axis parallel to an edge of the printed substrates once received in the first stack 212. For example, in FIGS. 2 and 3, the x-axis is aligned with the length dimension of the substrates 202.

Similarly, a second axis may also be defined that is perpendicular to the first axis. For example, the second axis may be the y-axis shown depicted in FIGS. 2 and 3. In FIGS. 4 and 5, the y-axis extends out of the page. Movement in along the second axis includes any motion substantially parallel to the y-axis and includes both forwards and backwards motion along the y-axis. In some examples, the second axis and therefore the y-axis is defined as being parallel to the direction in which the plurality of printed substrates 202 are received from the printer. In other examples, the second axis and therefore the y-axis is defined as a direction parallel to a longitudinal axis of the first and second stacking members. In other examples, the second axis and therefore the y-axis is defined as a direction parallel to an edge of the printed substrates once received in the first stack 212. For example, in FIGS. 2 and 3, the y-axis is aligned with the width dimension of the substrates 202.

After the first stack 212 has been deposited onto the second stack 220, the vertical position of the new stack can be adjusted so that another stack can be received. As mentioned, the second stack may be stacked within a receptacle 222. The receptacle may be a container, or a platform for example. The vertical position of the receptacle may be altered by the actuator 224. For example, the controller may cause the position of the receptacle to be adjusted by instructing the actuator 224 to move the receptacle 222. The controller may therefore be configured to adjust a position of the receptacle 222 in the vertical direction, along a vertical axis, such that the second stack 220 of printed substrates is positioned to partially support the first stack 212 of printed substrates while the stacking member is in the first position. Hence, the vertical position of the receptacle 222, and the second stack 220 can be adjusted so that it is at the correct height to receive, and partially support the first stack 212. In one example, the vertical axis may be defined as being perpendicular to both the first and second axes, and therefore perpendicular to both the x-axis and the y-axis. Movement along the vertical axis can mean both upwards motion and downwards motion, for example.

As mentioned, a controller, such as controller 112, may cause the stacking members 206, 208 to disengage from the first stack 212. For example, the controller may instruct the actuators to adjust the position of the stacking members 206, 208. This disengagement may be caused to occur when the first stack 212 of substrates satisfies a criterion. For example, the controller may be continuously or periodically monitoring at least one of: (i) a count/quantity of the plurality of printed substrates within the first stack 212, (ii) a height dimension of the plurality of printed substrates within the first stack 212 or (iii) a total mass of the plurality of printed substrates within the first stack 212. Hence, the controller may determine that the criterion is satisfied when at least one of: (i) the count of the plurality of printed substrates within the first stack 212 reaches a predetermined threshold count, (ii) the height dimension of the plurality of printed substrates within the first stack 212 reaches a predetermined threshold height or (iii) the mass of the plurality of printed substrates within the first stack 212 reaches a predetermined threshold mass.

In some examples these parameters are calculated or inferred. For example the current height of the stack 212 may be calculated by multiplying the number of substrates in the stack 212 by a predetermined thickness dimension of a single substrate. Similarly, the current mass of the stack 212 may be calculated by multiplying the number of substrates in the stack 212 by a predetermined mass of a single substrate. The number of substrates in the stack 212 may be measured by a sensor, estimated based on the period of time elapsed if the printing speed is known, or determined based on information received from the printing system. In other examples height or mass of the stack 212 may be measured using one or more sensors, such as optical sensor to measure the height or a weight sensor to measure a force applied by the stack on a stacking member. Once the threshold has been reached, the criterion is satisfied, and the controller instructs the first and second stacking members to disengage. Any "noise" present in the first stack, for example caused by vertical misalignment, can be reduced by beginning a new stack, for example the size of a first stack may be smaller than the second stack. Vertical misalignment may be as a result of one or more warped substrates or folded corners of one or more substrates, for example.

In some examples one or more of the first and second stacking members 206, 208 may comprise upright members against which an edge of the substrates can engage. For example, as best depicted in FIGS. 4 and 5, the first stacking member 206 may comprise a first upright member 226, and the second stacking member 208 may comprise a second upright member 228. The first and second upright members extend generally perpendicular to a flat surface of the stacking member that received the substrate. In this example the first and second upright members 226, 228 are integrally formed with the first and second stacking members 206, 208 respectively, however, in other examples the first and second upright members 226, 228 may be separate from the first and second stacking members 206, 208. In examples where the upright members are components of the stacking members, the stacking members may be said to have an "L-shape" or an "inverted T-shape". In some examples an upright member comprises one or more upright components. Hence, the upright member may not be a continuous upright member. An upright member may be a wall, or an elongate protrusion, for example or a series of spaced protrusions. The upright members 226, 228 are positioned adjacent to edges of the first stack of substrates. For example they are positioned along opposite edges parallel to the second axis, and therefore parallel to the transport direction into the stacking system.

In some examples the first and second upright members 226, 228 move independently of the first and second stacking members 206, 208. The first and second upright members 226, 228 may move relative to the first and second stacking members 206, 208, or movement of the first and second upright members 226, 228 may be fixed relative to the first and second stacking members 206, 208.

In the examples of FIGS. 2-5, the first and second upright members 226, 228 are spaced from each other to receive the plurality of printed substrates therebetween, and are arranged parallel to each other. As shown in FIGS. 2 and 3, the first and second upright members 226, 228 are arranged parallel to the second axis, such as parallel to the transport direction 210, and each abut an edge of the first stack 212. In some examples, the first and second upright members 226, 228 can be used to align the plurality of printed substrates received between them, so that the edges of the substrates in contact with the first and second upright members 226, 228 can be aligned, and thereby meet any stack quality specifications. Aligning the substrates along an axis means that the substrates are aligned within an acceptable limit, such as less than about 5 mm, or about 3 mm between the edge of a substrate forming the outermost point of the stack and a corresponding edge of a substrate forming the innermost point of the stack, for example. Alignment along an axis may mean that the maximum difference in the position of corresponding edges of substrates in the stack in the direction perpendicular to the edge of the substrate less than or equal to the acceptable limit.

The alignment along the first axis can be achieved by repeatedly-moving/vibrating one, or both, of the first and second upright members 226, 228 back and forth along the first axis. Hence the substrates within the first stack 212 are agitated by the motion.

Figure 6:
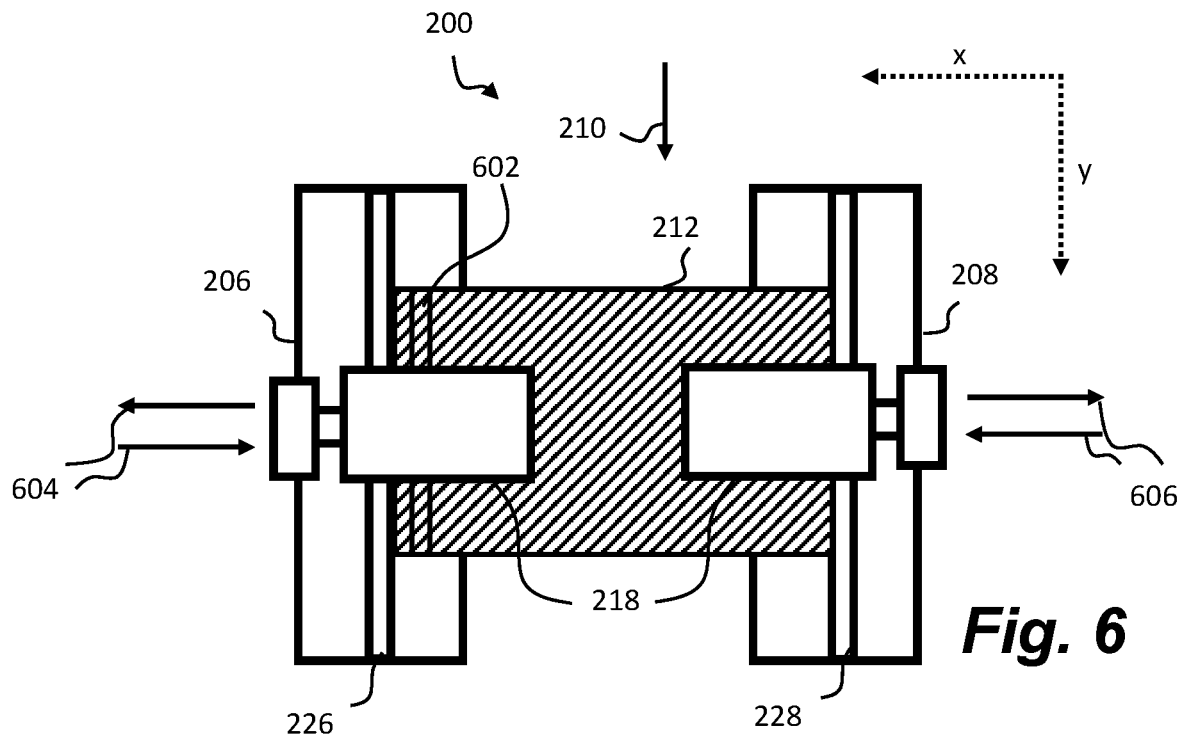
FIG. 6 is a diagrammatic representation showing a plan view of the stacking system of FIG. 2 with an example of a misaligned stack.

FIG. 6 depicts the system 200 in which some of the substrates within the first stack 212 are misaligned. Region 602 shows a number of substrates within the stack 212 that are offset relative to the substrate on the top of the stack 212. To align the substrates within the stack along the first axis, one or more of the first and second upright members 226, 228 may be caused to vibrate along the first axis, such as perpendicular to the transport direction 210. For example, this may include causing one or more of the first and second stacking members 206, 208 to vibrate along the first axis, for example by causing one or more of the actuators 218 to move the stacking members. This instruction may be received from a controller, for example. This motion/vibration is indicated by arrows 604 and 606, hence vibrating along the first axis includes both forwards and backwards motion parallel to the first axis.

This vibration causes the substrates within the first stack 212 to be agitated and move into alignment along the first axis. For example, the plurality of printed substrates within the first stack 212 are agitated between the first and second upright members 226, 218. "Agitating" the first stack 212 may also be described as vibrating, oscillating or manipulating the first stack.

Figure 7:
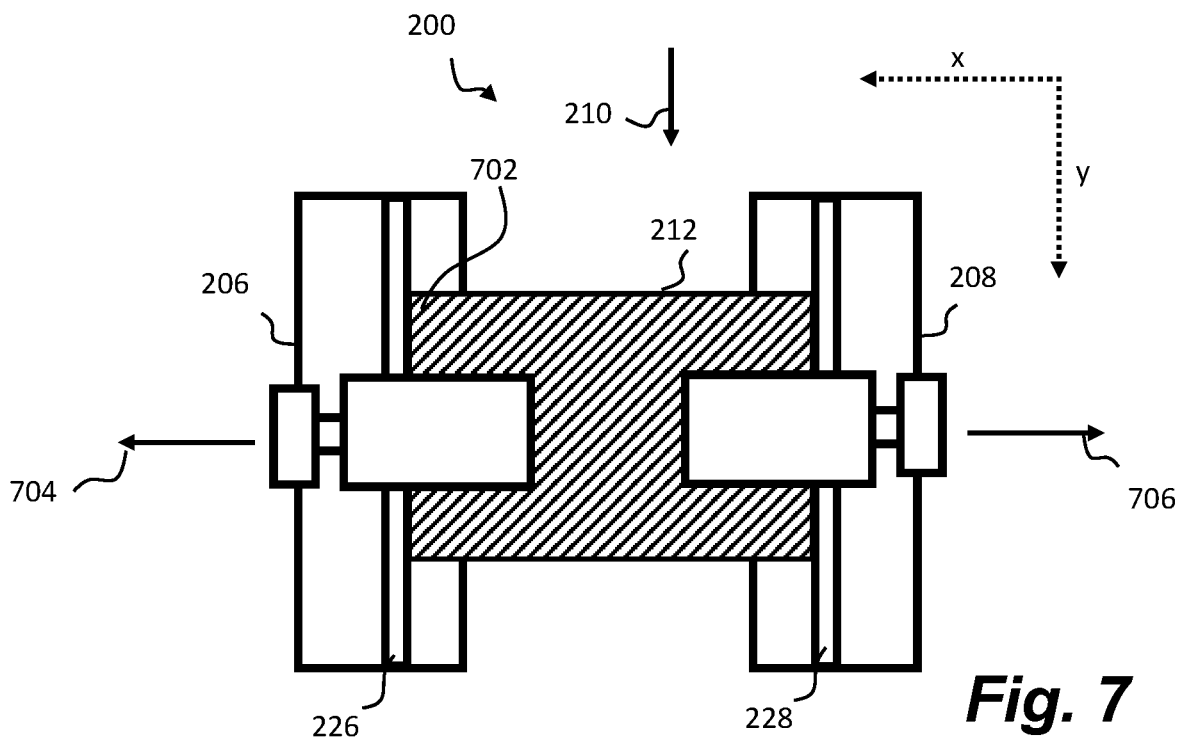
FIG. 7 is a diagrammatic representation showing a plan view of the stacking system of FIG. 2 with an example of an aligned stack.

FIG. 7 depicts the first stack 212 after the vibration has occurred. Region 702 shows that the substrates within the first stack have been substantially aligned, and may therefore meet any stack quality specifications, should any be in place. As can be seen in FIGS. 6 and 7, this alignment is performed on the first stack 212, while the substrates are being supported by the first and second stacking members 206, 208. After this alignment has occurred, the stacking members 206, 208 can disengage from the first stack 212 so that the substrates are stacked on the second stack located underneath. Hence, the first stacking member 206 may move away from the first stack 212 and from the second stacking member 208 in the direction of arrow 704. Similarly, the second stacking member 208 may move away from the first stack 212 and from the first stacking member 206 in the direction of arrow 706.

In addition to the above described motion of the first and second stacking members 206, 208, one or more of the stacking members 206, 208 may also move relative to each other along the first axis to accommodate different sized substrates. Hence, in one example, a controller may be configured to adjust a spacing between the first and second stacking members 206, 208 based on a size dimension of the printed substrates by causing at least one of the first and second stacking members to move along the first axis. In this example therefore, the size dimension may be a first size dimension measured along the first axis. For example, in FIGS. 2-5, the first size dimension is a length dimension, however in other examples, the first size dimension may be a width dimension if the substrates are orientated differently. Here a length dimension is the dimension of the substrate that has the longest length, and a width dimension is the dimension of the substrate that has the shortest length.

As described in relation to FIGS. 6 and 7, one or both of the first and second stacking members 206, 208 can be vibrated along the first axis to align the substrates along the first axis. In some instances, the substrates within the first stack 212 may also be misaligned along the second axis, such as along an axis parallel to the transport direction. To align the first stack along the second axis, the first stack may also be agitated along the second axis. To achieve this, one or more additional members may be used.

Figure 8:
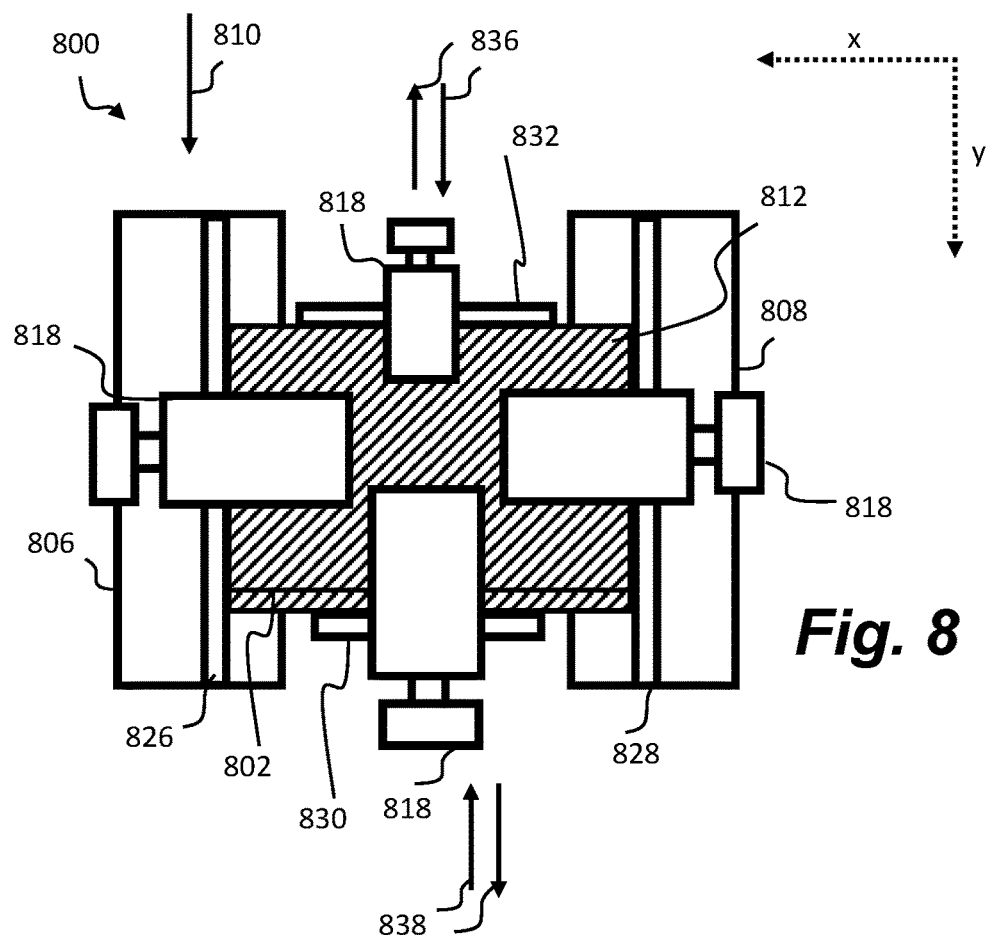
FIG. 8 is a diagrammatic representation showing a plan view of another stacking system according to an example with an example of a misaligned stack.
Figure 9:
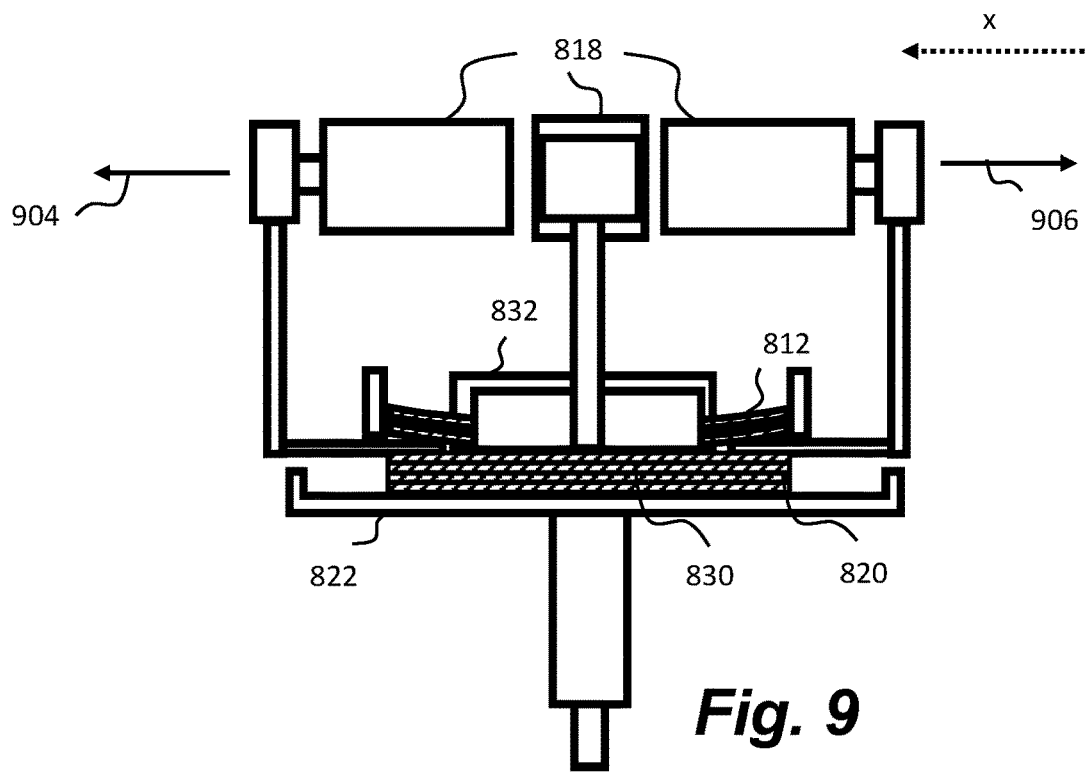
FIG. 9 is a diagrammatic representation showing a side view of the stacking system of FIG. 8 and an example of an aligned stack in accordance with an example.

FIG. 8 depicts a top-down view of another example stacking system 800 and FIG. 9 depicts a side view of the stacking system 800. The stacking system 800 may be substantially similar to the stacking system 200, but with additional components. The stacking system 800 comprises a first stacking member 806 with a first upright member 826, a second stacking member 808 with a second upright member 828, and a first stack 812 of substrates being supported by the stacking members 806, 808. The positioning of the first and second stacking members 806, 808 along the first axis can be adjusted by the actuators 818. In addition to these components, the stacking system 800 further comprises a first end member 830 and a second end member 832. The first end member 830 and second end member 832 are spaced from each other and are parallel to each other. The end members are configured to receive a plurality of printed substrates therebetween. The end members each comprise upright components that engage with peripheral edges of the printed substrates within the first stack 812. In this example the end members are aligned parallel to the first axis, and therefore the x-axis, which may be perpendicular to the transport direction 810 in some examples. In this example the first end member 830 is positioned adjacent to a leading edge of the first stack 812, and the second end member 832 is positioned adjacent to a trailing edge of the first stack 812. For example, the leading edge may be defined as the edge of the substrate first received within the stacking system 800 in the transport direction indicated by arrow 810. The trailing edge is therefore the opposite edge of the substrate. In other examples the first and second end members are positioned adjacent to first and second edges, respectively.

In the example of FIGS. 8 and 9, the system 800 comprises two separate end members 830, 832, however the first and second end members 830, 832 may each be two or more end members in other examples.

FIG. 8 depicts the first and second end members 830, 832 arranged perpendicular to the transport direction 810, and are therefore also parallel to an edge of the substrates within the first stack 812. One or more actuators 818 allow the positioning of the end members 830, 832 to be adjusted. For example, a controller may be configured to adjust the spacing between the first and second end members 830, 832 based on a size dimension of the printed substrates, by causing at least one of the first and second end members 830, 832 to move along the second axis, and therefore the y-axis, which may be parallel to the transport direction 810 in some examples. The size dimension may be a second size dimension measured along the second axis, for example a size dimension measured in a direction along the transport direction 810. In FIG. 8, the second size dimension is a width dimension however in other examples, the second size dimension may be a length dimension if the substrates are orientated differently. Here a length dimension is the dimension of the substrate that has the longest length, and a width dimension is the dimension of the substrate that has the shortest length. Accordingly, the spacing between the end members can be adjusted to accommodate different sized substrates.

The positioning of the first and second end members 830, 832 may also be adjusted to align the first stack 812 along the second axis so that the edges of the substrates in contact with the first and second end members 830, 832 can be aligned, and thereby meet any stack quality specifications. The alignment along the second axis can be achieved by repeatedly-moving/vibrating one, or both, of the first and second end members 830, 832 along the second axis. Hence the substrates within the first stack 812 become agitated as a result of this motion.

FIG. 8 depicts the system 800 in which some of the substrates within the first stack 812 are misaligned. Region 802 shows a number of substrates within the stack 812 that are offset relative to the substrate on the top of the stack 812. To align the substrates within the stack along the second axis, one or both of the first and second end members 830, 832 may be caused to vibrate along the second axis, for example back and forth along the transport direction 810. This motion may be achieved by causing one or more of the actuators 818 to move the end members. This instruction may be received from a controller, for example. This motion/vibration is indicated by arrows 836 and 838, hence vibrating along the second axis includes both forwards and backwards motion parallel to the second axis.

This vibration causes the substrates within the first stack 812 to be agitated and align along the second axis. For example, the plurality of printed substrates within the first stack 812 are agitated between the first and second end members 830, 832. The alignment along the second axis may occur in addition to the alignment along the first axis. The first and second stacking members 806, 808 may remain stationary while the alignment along the second axis occurs. Either of these alignment procedures may be performed first, and in some examples both occur simultaneously such that the first and second stacking members are not stationary.

After the vibration has occurred, the substrates within the first stack 812 will be substantially aligned, and may therefore meet any stack quality specifications, should any be in place. As can be seen in FIGS. 8 and 9, this alignment is performed on the first stack 812, while the substrates are being supported by the first and second stacking members 806, 808. After this alignment has occurred, the stacking members 806, 808 disengage from the first stack 812 so that the substrates are stacked on the second stack 820 located on a receptacle 822 underneath. Hence, the first stacking member 806 may move away from the first stack 812 and from the second stacking member 808 in the direction of arrow 904, such as transverse to the transport direction 810. Similarly, the second stacking member 808 may move away from the first stack 812 and from the first stacking member 806 in the direction of arrow 906, such as transverse to the transport direction 810 in the opposite direction to the first stacking member.

Figure 10:
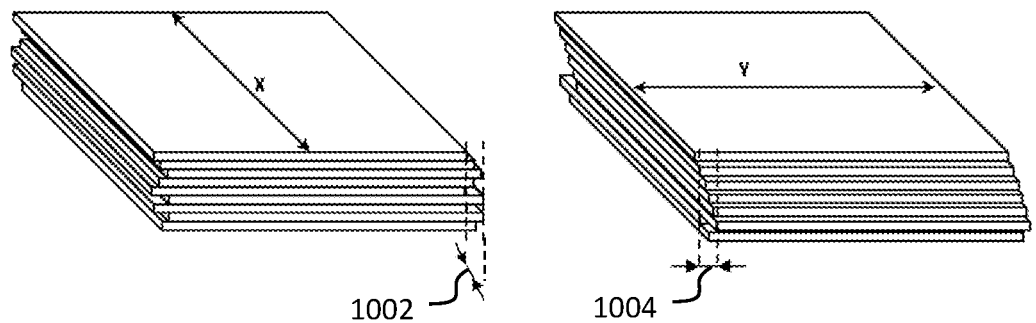
FIG. 10 is a diagrammatic representation of a perspective view of a first example stacking scheme.

The above discussion therefore describes how a first stacking scheme can be realised using the example stacking system. FIG. 10 depicts a perspective view of an example stack of substrates. The first stacking scheme may specify a stack quality specification, that may need to be adhered to. The stack quality specification may specify that the maximum offset between substrates in a stack along any axis is no greater than a predetermined measurement value, such as about 10 mm, 5 mm, or 3 mm for example. FIG. 10 shows the maximum offset measured along the first axis 1002, and the maximum offset measured along the second axis 1004. Hence, to avoid the substrates within the first stack 212, 812 being offset by a value greater than this, the substrates may be aligned along both the first and second axes according to the procedures described above.

Figure 11:
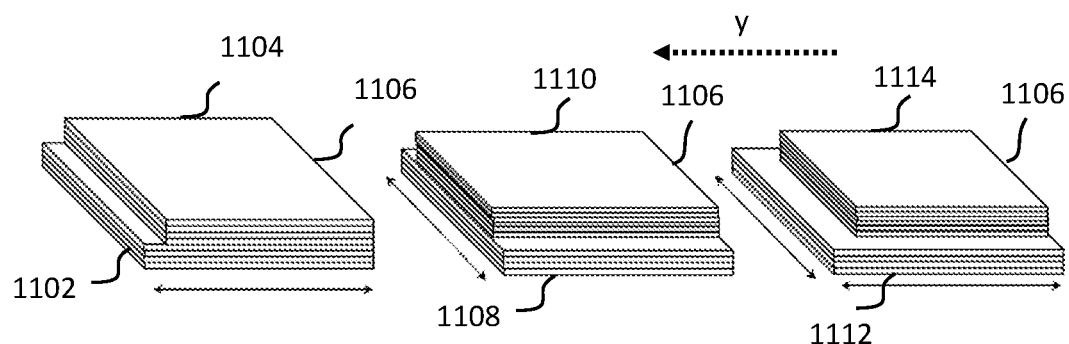
FIG. 11 is a diagrammatic representation of a perspective view of three second example stacking schemes.

A second stacking scheme may specify how substrates of different sizes/dimensions are stacked on top of each other. FIG. 11 depicts a perspective view of three stacks of substrates. Substrates within a first batch 1102, 1108, 1112 may be of the same size, whereas second subsequent batches 1104, 1110, 1114 may be of a different size to the first batches. As is shown, the first and second batches may be aligned along any edge of the substrates, such as the trailing edge 1106.

To position a second batch relative to a first batch, the example stacking system can move and/or position substrates being stacked by using one or more of the stacking members and/or one or more of the end members.

In a first example, to offset the second batch 1104 from the first batch 1102 as shown, the first stack of substrates being received on the first and second stacking members can be positioned relative to the second stack. This can be achieved by causing the position of the first end member to be adjusted along the second axis, such as in a direction parallel to the transport direction. For example, with reference to FIG. 8, the first end member 830 may move inwards and towards the second end member 832, whereas the second end member 830 may remain stationary. Accordingly, the substrates within the first stack 812 may be aligned along the trailing edge of the stack. This motion can be performed before the first stack is created, or once the first stack has been created.

In a second example, to offset the second batch 1110 from the first batch 1108 as shown, the first stack of substrates being received on the first and second stacking members can be positioned relative to the second stack. This can be achieved by causing the position of both first and second stacking members to be adjusted along the first axis. For example, with reference to FIG. 8, both first and second stacking members 806, 808 may move inwards and towards each other, perpendicular to the transport direction, whereas the first and second end members 830, 832 may remain stationary. Because the substrates within both batches have the same width dimension, the end members 830, 830 may not need to adjust their position. Accordingly, the substrates within the first stack 812 may be aligned along the trailing edge of the stack. Again, this motion can be performed before the first stack is created, or once the first stack has been created.

In a third example, to offset the second batch 1114 from the first batch 1112 as shown, the first stack of substrates being received on the first and second stacking members can be positioned relative to the second stack. This can be achieved by causing the position of both first and second stacking members to be adjusted along the first axis, and by causing the position of the first end member to be adjusted along the second axis. For example, with reference to FIG. 8, both first and second stacking members 806, 808 may move inwards and towards each other, perpendicular to the transport direction, and the first end member 830 may move inwards and towards the second end member 832, whereas the second end member 832 may remain stationary. In this example the substrates in the second batch have different length and width dimensions to the substrates in the first batch. By keeping the second end member 832 stationary, the batches can be aligned along their trailing edge. Again, this motion can be performed before the first stack is created, or once the first stack has been created.

Figure 12:
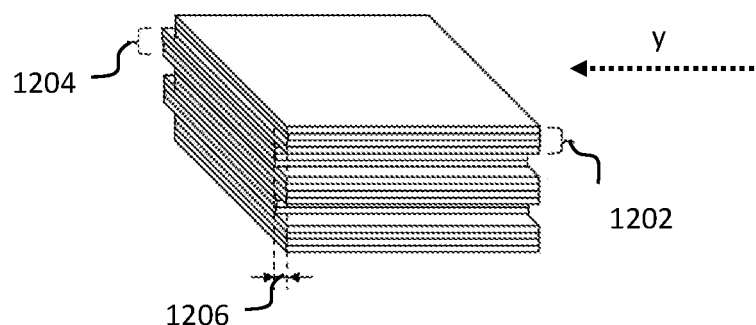
FIG. 12 is a diagrammatic representation of a perspective view of a third example stacking scheme.

A third stacking scheme may specify how batches of substrates are distinguished from other batches. Offsetting, which may also be known as "jog-offsetting" is a process whereby batches or print-jobs are laterally offset or displaced from each other. This allows each batch to be easily identifiable from other batches. FIG. 12 depicts a stack of substrates within which batches have been laterally offset from adjacent batches. A first batch 1202 is shown offset from a second batch 1204, where the second batch 1204 is located beneath the first batch 1202. Although FIG. 12 depicts the batches being offset along the first axis, such as perpendicular to a transport direction, it will be appreciated that the batches may be offset along the second axis, such as parallel to the transport direction.

To offset a second batch relative to a first batch, the example stacking system can move and/or position substrates being stacked by using one or more of the stacking members and/or one or more of the end members. For example, to offset the first batch 1202 from the second batch 1204, the first stack of substrates being received on the first and second stacking members can be positioned relative to the second stack. This can be achieved by causing the position of one or both of the first and second stacking members to be adjusted along the first axis. For example, one or both of the first and second stacking members may move together in the same direction along the first axis, whereas the first and second end members may remain stationary. This motion can be performed before the first stack is created, or once the first stack has been created.

Figure 13:
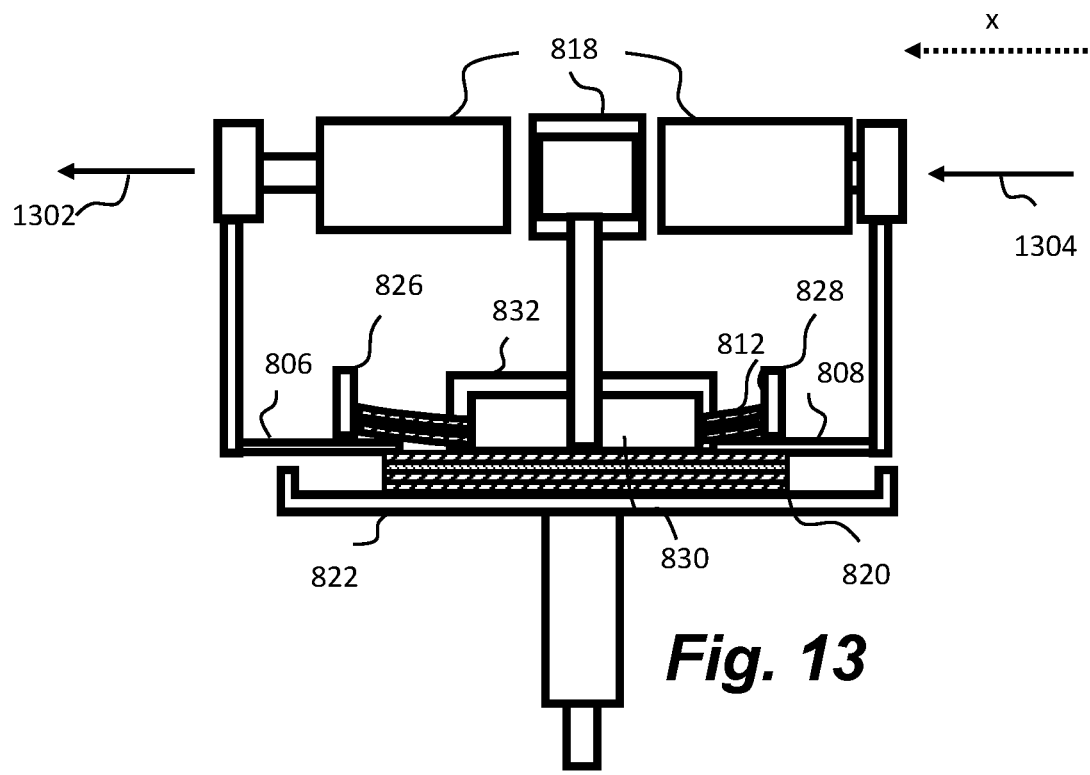
FIG. 13 is a diagrammatic representation showing a side view of the stacking system of FIG. 8 and an example of an offset stack.
Figure 14:
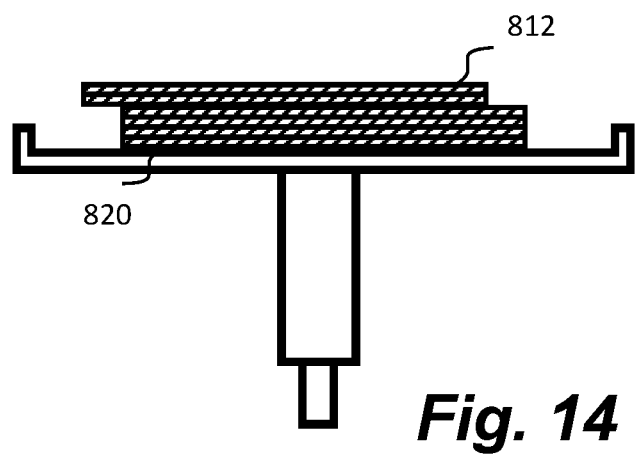
FIG. 14 is a diagrammatic representation showing a side view of an offset stack in accordance with an example.

FIG. 13 depicts the example system 800 being controlled to create an offset. In this configuration, the first stacking member 806 (and therefore the first upright member 826) has already been moved along the first axis, in a direction indicated by arrow 1302, such as perpendicular to a transport direction. Similarly, the second stacking member 808 (and therefore the second upright member 828) has already been moved along the first axis, in a direction indicated by arrow 1304, such as perpendicular to a transport direction. The first stack 812, which may make up a component of the first batch 1202, is therefore offset with respect to the second stack 820. Once in position, the first stack can be deposited onto the second stack to achieve the offset, as depicted in FIG. 14. This can be achieved by a controller being configured to adjust a position of at least one of the first and second stacking members along a first axis to offset the first stack from the second stack along the first axis. It will be appreciated that the first and second upright members may not need to be present to achieve this offset. The lateral position of the stack can be adjusted regardless of the presence of the upright members. Hence, in some examples, the first and second upright members are absent.

To achieve an offset along the second axis, such as in a direction parallel to a transport direction, the controller may be configured to adjust a position of at least one of the first and second end members 830, 832 along the second axis to offset the first stack from the second stack along the second axis.

Figure 15:
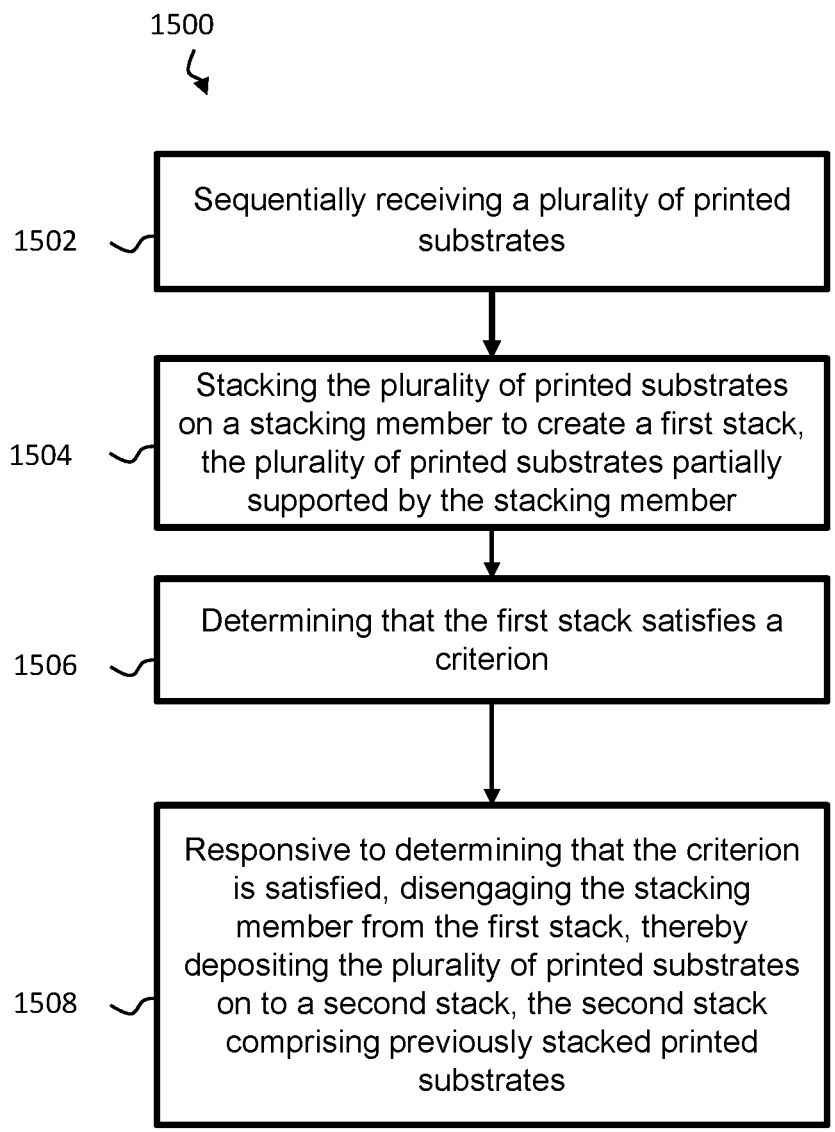
FIG. 15 is a flow diagram showing a method in accordance with an example.

FIG. 15 is a flow diagram showing a method 1500. The method can be performed by the example systems 200, 800. At block 1502 the method comprises sequentially receiving a plurality of printed substrates. At block 1504 the method comprises stacking the plurality of printed substrates on a stacking member to create a first stack, the plurality of printed substrates partially supported by the stacking member. At block 1506 the method comprises determining that the first stack satisfies a criterion. At block 1508 the method comprises, responsive to determining that the criterion is satisfied, disengaging the stacking member from the first stack, thereby depositing the plurality of printed substrates on to a second stack, the second stack comprising previously stacked printed substrates.

In some example methods, the stacking member is a first stacking member, and the method may further comprise stacking the plurality of printed substrates on the first stacking member and a second stacking member to create the first stack, the plurality of printed substrates partially supported by the first and second stacking members; and responsive to determining that the criterion is satisfied, disengaging the first stacking member and the second stacking member from the first stack.

In some example methods, the method may further comprise agitating the first stack to align the plurality of printed substrates. In some examples this comprise one or both of (i) agitating the first stack along a first axis to align the plurality of printed substrates along the first axis; and (ii) agitating the first stack along a second axis perpendicular to the first axis to align the plurality of printed substrates along the second axis.

In some example methods, agitating the first stack comprises at least one of: (i) vibrating one or more of the first and second stacking members along a first axis to align the plurality of substrates along the first axis; and (ii) vibrating one or more of a first end member and a second end member along a second axis perpendicular to the first axis to align the plurality of substrates along the second axis.

In some example methods, agitating the first stack along the first axis comprises: vibrating at least one of the first and second stacking members along the first axis; and agitating the plurality of printed substrates between first and second upright members arranged parallel to the second axis, the first and second upright members being spaced from and parallel to each other. Agitating the first stack along the second axis may comprise: keeping the first and second stacking members stationary; vibrating at least one of a first end member and a second end member along the second axis; and agitating the plurality of printed substrates between the first and second end members, the first and second end members being arranged parallel to the first axis, and being spaced from and parallel to each other.

In some example methods, the method may further comprise partially supporting the first stack by the second stack. This may be performed during stacking the plurality of printed substrates on a stacking member to create a first stack.

In some example methods, the method may further comprise offsetting the first stack from the second stack along a first axis by adjusting a position of at least one of the first and second stacking members along the first axis.

In some example methods, the method may further comprise offsetting the first stack from the second stack along a second axis by adjusting a position of at least one of a first end member and a second end member along the second axis, the first and second end members being spaced from and parallel to each other.

In some example methods, the method comprises monitoring at least one of: (i) a count of the plurality of printed substrates, and the criterion is satisfied when the count of the plurality of printed substrates reaches a predetermined threshold count; (ii) a height dimension of the plurality of printed substrates, and the criterion is satisfied when the height dimension of the plurality of printed substrates reaches a predetermined threshold height; and (iii) a mass of the plurality of printed substrates, and the criterion is satisfied when the mass of the plurality of printed substrates reaches a predetermined threshold mass.

Certain system components and methods described herein may be implemented by way of non-transitory computer program code that is storable on a non-transitory storage medium. In some examples, the controller 112 may comprise a non-transitory computer readable storage medium comprising a set of computer-readable instructions stored thereon. The controller 112 may further comprise one or more processors 1604. In some examples, control may be split or distributed between two or more controllers 112 which implement all or parts of the methods described herein.

Figure 16:
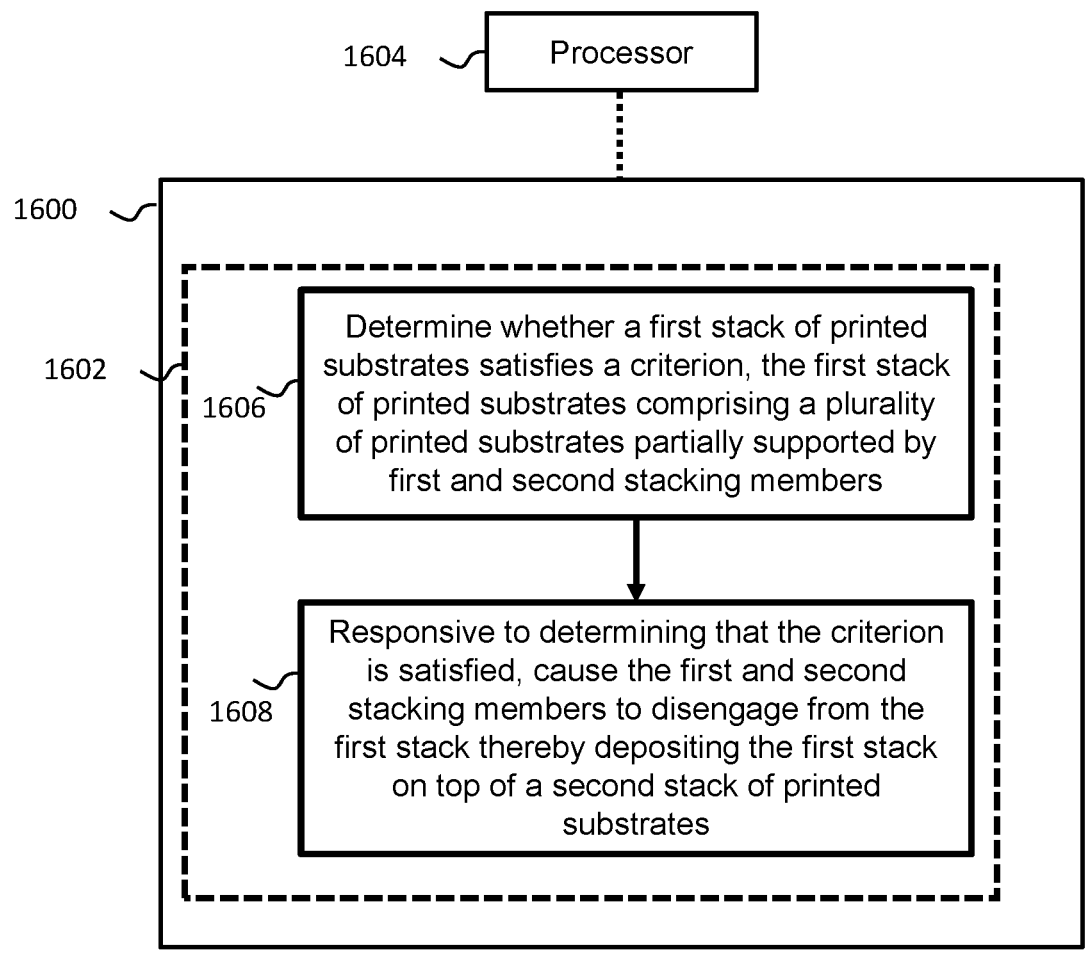
FIG. 16 is a diagrammatic representation of an example set of computer-readable instructions within a non-transitory computer-readable storage medium.

FIG. 16 shows an example of such a non-transitory computer-readable storage medium 1600 comprising a set of computer readable instructions 802 which, when executed by at least one processor 804, cause the processor(s) 804 to perform a method according to examples described herein. The computer readable instructions 800 may be retrieved from a machine-readable media, e.g. any media that can contain, store, or maintain programs and data for use by or in connection with an instruction execution system. In this case, machine-readable media can comprise any one of many physical media such as, for example, electronic, magnetic, optical, electromagnetic, or semiconductor media. More specific examples of suitable machine-readable media include, but are not limited to, a hard drive, a random access memory (RAM), a read-only memory (ROM), an erasable programmable read-only memory, or a portable disc.

In an example, instructions 1602 cause the processor 1604 in a stacking system to, at block 1606 determine whether a first stack of printed substrates satisfies a criterion, the first stack of printed substrates comprising a plurality of printed substrates partially supported by first and second stacking members. At block 1608, the instructions 1602 cause the processor 1604 to, responsive to determining that the criterion is satisfied, cause the first and second stacking members to disengage from the first stack thereby depositing the first stack on top of a second stack of printed substrates.

What is claimed is:

1. A method of stacking printed substrates, the method comprising:
   sequentially receiving a plurality of printed substrates;
   stacking the plurality of printed substrates on a first stacking member and a second stacking member to create a first stack, the plurality of printed substrates partially supported by the first and second stacking members and partially supported by a second stack, the second stack comprising previously stacked printed substrates;
   determining that the first stack satisfies a criterion; and
   responsive to determining that the criterion is satisfied, disengaging the first stacking member and the second stacking member from the first stack, thereby depositing the plurality of printed substrates on to the second stack.

2. A method according to claim 1, wherein the method further comprises agitating the first stack to align the plurality of printed substrates.

3. A method according to claim 2, wherein agitating the first stack comprises at least one of:
   vibrating one or more of the first and second stacking members along a first axis to align the plurality of substrates along the first axis; and
   vibrating one or more of a first end member and a second end member along a second axis perpendicular to the first axis to align the plurality of substrates along the second axis.

4. A method according to claim 1, further comprising:
   offsetting the first stack from the second stack along an axis by adjusting a position of at least one of a first end member and a second end member along the axis, the first and second end members being spaced from and parallel to each other.

5. A method according to claim 1, wherein the method comprises monitoring at least one of:

a count of the plurality of printed substrates, and the criterion is satisfied when the count of the plurality of printed substrates reaches a predetermined threshold count;

a height dimension of the plurality of printed substrates, and the criterion is satisfied when the height dimension of the plurality of printed substrates reaches a predetermined threshold height; and a mass of the plurality of printed substrates, and the criterion is satisfied when the mass of the plurality of printed substrates reaches a predetermined threshold mass.

6. A stacking system for printed substrates, the stacking system comprising:
- a stacking member, movable between a first position in which the stacking member is configured to partially support a first stack of printed substrates, and a second position in which the stacking member is disengaged from the first stack;
- a receptacle positioned below the stacking member and configured to hold a second stack of printed substrates;
- an actuator configured to move the receptacle along a vertical axis; and
- a controller configured to
  - adjust a position of the receptacle along the vertical axis, such that the second stack of printed substrates are positioned to partially support the first stack of printed substrates while the slacking member is in the first position; and
  - cause the stacking member to move between the first position and the second position when the first stack satisfies a criterion, thereby depositing the first stack into the receptacle on top of the second stack.

7. A stacking system according to claim 6, wherein the stacking member is a first stacking member, and the system further comprises:
- a second stacking member movable between a third position in which the second stacking member is configured to partially support the first stack of printed substrates, and a fourth position in which the second stacking member is disengaged from the first stack;
- wherein the controller is configured to cause the second stacking member to move between the third position and the fourth position when the first stack satisfies the criterion.

8. A stacking system according to claim 7, wherein the controller is configured to cause at least one of the first and second stacking members to vibrate along a first axis to align the plurality of printed substrates along the first axis.

9. A stacking system according to claim 8, further comprising:
- a first end member positioned adjacent to a leading edge of the first stack; and
- a second end member positioned adjacent to a trailing edge of the first stack;
- wherein the controller is configured to cause:
  - at least one of the first and second end members to vibrate along a second axis perpendicular to the first axis to align the plurality of printed substrates along the second axis.

10. A system according to claim 7, further comprising:
- a first end member positioned adjacent to a leading edge of the first stack; and
- a second end member positioned adjacent to a trailing edge of the first stack;
- wherein the controller is configured to at least one of:
- adjust a position of at least one of the first and second stacking members along a first axis to offset the first stack from the second stack along the first axis; and
- adjust a position of at least one of the first and second end members along a second axis perpendicular to the first axis to offset the first stack from the second stack along the second axis, wherein the first and second end members are arranged parallel to the first axis.

11. A system according to claim 10, wherein the controller is configured to:
- adjust a spacing between the first and second stacking members based on a size dimension of the printed substrates by causing at least one of the first and second stacking members to move along the first axis.

12. A non-transitory computer-readable storage medium storing instructions that, when executed by one or more processors in a stacking system, cause the one or more processors to:
- determine whether a first stack of printed substrates satisfies a criterion, the first stack of printed substrates comprising a plurality of printed substrates partially supported by first and second stacking members and partially supported by a second stack, the second stack comprising previously stacked printed substrates; and
- responsive to determining that the criterion is satisfied, cause the first and second stacking members to disengage from the first stack thereby depositing the first stack on top of the second stack of printed substrates.

* * * * *